United States Patent [19]

von Ammon et al.

[11] Patent Number: 4,749,837
[45] Date of Patent: Jun. 7, 1988

[54] INDUCTION HEATING COIL FOR THE FLOATING ZONE PULLING OF CRYSTAL RODS

[75] Inventors: Wilfried von Ammon, Burghausen; Heinz Klinger, Altötting, both of Fed. Rep. of Germany

[73] Assignee: Wacker Chemitronic Gesellschaft, Burghausen, Fed. Rep. of Germany

[21] Appl. No.: 11,067

[22] Filed: Feb. 4, 1987

[30] Foreign Application Priority Data

Feb. 6, 1986 [DE] Fed. Rep. of Germany ....... 3603766

[51] Int. Cl.[4] .................... H01F 27/28; H01F 27/30
[52] U.S. Cl. .................... 219/10.79; 336/223; 336/232
[58] Field of Search ............. 219/10.79; 336/207, 336/232

[56] References Cited

U.S. PATENT DOCUMENTS 1,891,481 12/1932 Scofield .......................... 336/207
3,886,509  5/1975 Keller ............................ 336/232

Primary Examiner—A. D. Pellinen
Assistant Examiner—Leon K. Fuller
Attorney, Agent, or Firm—Collard, Roe & Galgano

[57] ABSTRACT

An induction heating coil for a zone pulling of semiconductor rods assures the disturbance-free performance of the pulling process even at the high power densities required for large rod diameters (approximately 10 to 12 cm). According to the invention, the arc-over paths between surfaces in the region of the coil slot, which are at differing potentials, are covered by one or more movable planar structures of temperature-stable insulating material which are introduced into the coil slot.

8 Claims, 3 Drawing Sheets

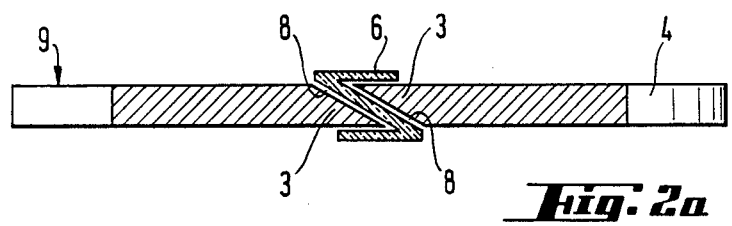
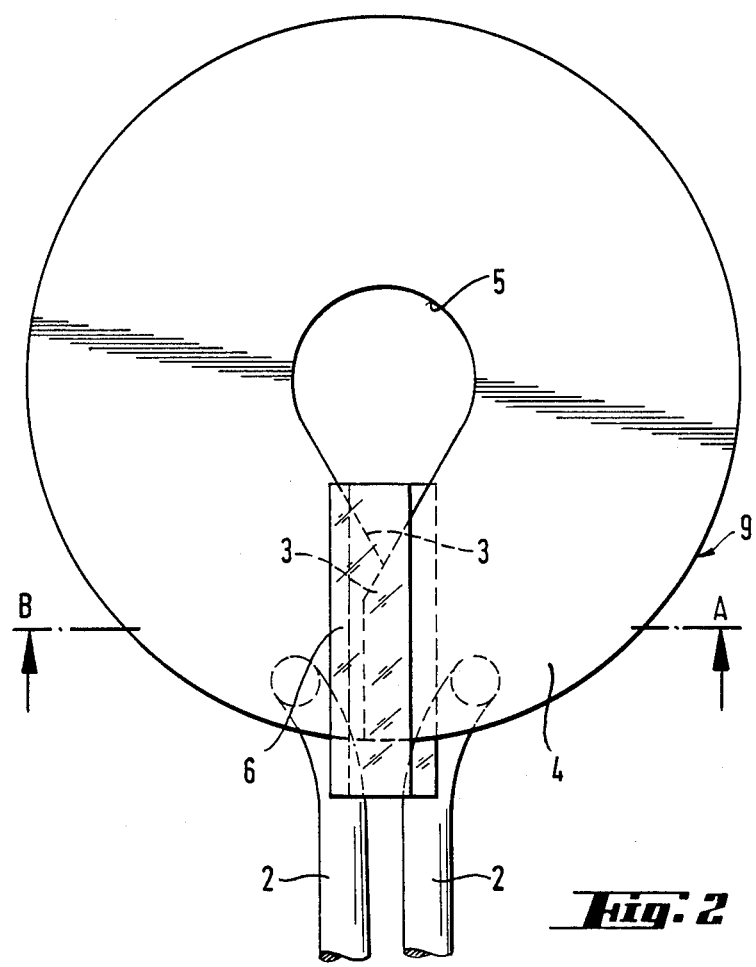

INDUCTION HEATING COIL FOR THE FLOATING ZONE PULLING OF CRYSTAL RODS

This invention relates to an induction heating coil for the floating zone pulling of crystalline rods. More particularly, it relates to such a heating coil which surrounds the rod material in the melting zone in the manner of a ring and has coil ends separated from one another by a coil slot.

In the floating zone pulling of crystalline rods, in particular, of semiconductor materials, such as silicon or germanium, it is generally known that disturbances of the pulling process are observed primarily as a result of two causes: first, in the pulling of crystalline rods, which requires high electrical power densities, e.g., having diameters exceeding 7 cm, arc- or spark-overs easily occur in the region of the coil slot. Such arc-overs have an extremely unfavorable effect on the crystal quality and, moreover, damage the heating coil and the supply conductors. Thus, according to German Offenlegungsschrift No. 2,319,700 and German Offenlegungsschrift No. 2,422,077, the coil slot is sealed with sprayed-on aluminum oxide or polybismaleinimide and sealed under vacuum with a temperature-stable insulating material, e.g., quartz glass. Because of the firm connection of the insulating material to the coil ends, both types of induction heating coils are, however, difficult to produce and fragile, particularly in the course of installation and removal. Moreover, there is the danger of impurities as a result of the required adhesives, e.g., by evaporation.

Additionally, in the case of rods having relatively large diameters, the high field concentration in the coil slot resulting from the high power density can lead to instances of remelting, which are associated with the development of dislocations, at the outer edge in the vicinity of the rods solidification front. According to German Offenlegungsschrift No. 2,538,831, it is indeed possible to overcome this cause of disturbance by employing heating coils with overlapping coil ends. However, as a result of the geometry of the coil slot, the danger of arc-overs is particularly great in this case, so that operation can take place only with relatively low power densities. Conversely, if the spacing between the surfaces in the region of the coil slot which are at differing potentials is increased, in order to be able to increase the power density, then the coil thickness must also increase at this position. Thus, there is again an increase in the danger of contact between the supply or crystalline rod and the heating coil, as a result of which the melting and pulling process is disturbed in a sensitive manner.

It is therefore an object of the present invention to provide an induction heating coil, which in the course of floating zone pulling, permits the achievement of high power densities while, at the same time, assuring the disturbance-free performance of the pulling process.

It is a further object of the invention to provide an induction heating coil which is both uncomplicated and can be readily handled.

The foregoing and related objects are achieved by an induction heating coil wherein the arc-over paths between surfaces, which are at differing potentials, are covered by one or more planar structures of temperature-stable insulating material which are movably introduced into the coil slot.

As materials for such planar structures, consideration may be given to materials which under the conditions of zone pulling (i.e., at temperatures in the region of the melting point of the material forming the crystalline rod in each instance and the pressure conditions set in the container), are of stable shape, gas-tight and exhibit insulating properties. High-temperature-stable oxide materials, such as, for example, corundum, magnesium oxide or beryllium oxide; silicate materials, such as mullite or the alumosilicate designated as "Pythagoras mass", as well as, in particular, quartz, are accordingly and principally suitable. In spite of its fragility, quartz is preferably employed advantageously in the form of quartz glass, because of its purity, sealing properties, temperature stability and the versatile processing and shaping possibilities.

In the design of the planar structures, consideration must be given to the possible arc-over paths determined by the geometry of the region of the coil slot. In this connection, arc-overs can, in principle, occur between surfaces, the distance of which from one another is smaller than the maximum possible spark gaps arising from the prevailing conditions, i.e., essentially from the set potential differences and the existing working atmosphere. Thus, the danger of arc-overs exists, as a rule, not only in the coil slot itself but also in the region of the adjoining surfaces on the upper and lower sides of the coil as well as at the inner and outer peripheries or borders of the coil. Accordingly, it is important to ensure, by the shaping of the planar structures, that not only the coil slot itself, but also the endangered adjoining surface regions, are covered in a manner preventing arc-overs. For this purpose, it normally is sufficient to cover only the possible starting or terminal points of the arc-over path, although embodiments which cover both sides are fundamentally also feasible.

It is also expedient, in particular, with regard to the easy insertion and removal of the planar structures, to select the thickness thereof so that they do not sit snugly in the coil slot, but, even when the coil has been installed, with a play assuring easy movability, of advantageously approximately 0.1 to 2 mm. In the case of the quartz glass, which is preferably employed, material having a thickness of 1 to 6 mm is usually used for the preparation of the planar structures. However, arrangements are not excluded in which, when the coil has been removed, the planar structures sit movably in the coil slot, although when the coil has been installed the planar structures sit therein immovably, or snugly in a friction-like fit.

Arc-overs over the outer periphery of the coil are prevented in a simple manner, for example, in that the insulating planar structures project out from the coil slot beyond the outer periphery of the coil, and indeed to such an extent that the spark gap, corresponding to the respective pulling conditions, between the peripheral surfaces, which are at differing potentials, is exceeded. This projecting length is expediently determined empirically, and is, as a rule, 5 to 15 mm. It may possibly be necessary to cover the current supply conductors as well, at least in the vicinity of the coil.

Naturally, in the region of the inner hole of the coil, because of the closeness to the melting zone, the insulating planar structure introduced into the coil slot can project a sufficient distance over the inner periphery only in the case of large inner hole diameters of, typically, approximately 30 to 35 mm. Accordingly, for the avoidance of arc-overs over the inside of the coil, the coil slot is advantageously broadened in a funnel shape toward the inner periphery. As a result, in this region as well, a spacing of the surfaces which are at different potentials is achieved, which spacing, in conjunction with the insulating planar structures, makes the creation of arc-over paths impossible. Such a broadening can also possibly be provided towards the outer periphery of the coil.

Expediently, the opening angle, i.e., the angle between the vertex, at which the broadening of the coil slot commences, and the points at which the coil slot merges into the rounding of the inner hole of the coil, amounts to 20° to 120°. The clear width—measured between these two points—of the opening of the coil slot corresponds, in a favorable arrangement, to 0.3 to 1.8 times the radius of the inner hole.

In the case of the induction heating coil, according to the invention, the coil slot can, with particular advantage, be designed with overlapping coil ends, as described, for example, in German Offenlegungsschrft No. 2,538,831. With the aid of this embodiment, the danger of instances of remelting of the crystalline rod in the vicinity of the coil slot may be reduced without the occurrence of arc-overs having to be feared at high field strengths.

Other objects and features of the present invention will become apparent from the following detailed description when taken in combination with the accompanying drawings which disclose several embodiments of the invention. It is to be understood that the drawings are designed for the purpose of illustration only and are not intended as a definition of the limits of the invention.

In the drawings, wherein similar reference numerals denote similar elements throughout the several views:

FIG. 2 is a schematic plan view of an alternate embodiment of a heating coil embodying the present invention;

FIG. 2a is a section view taken along line A–B of FIG. 2;

FIGS. 3a–d are fragmentarily-illustrated, sectional views showing several embodiments of refinement of the coil slot and of the insulating planar structures introduced embodying the present invention.

Figure 1A:
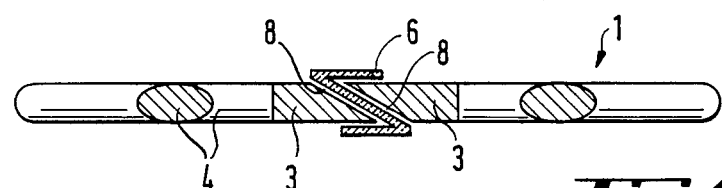
FIG. 1a is a sectional view taken along line A–B of FIG. 1.
Figure 1:
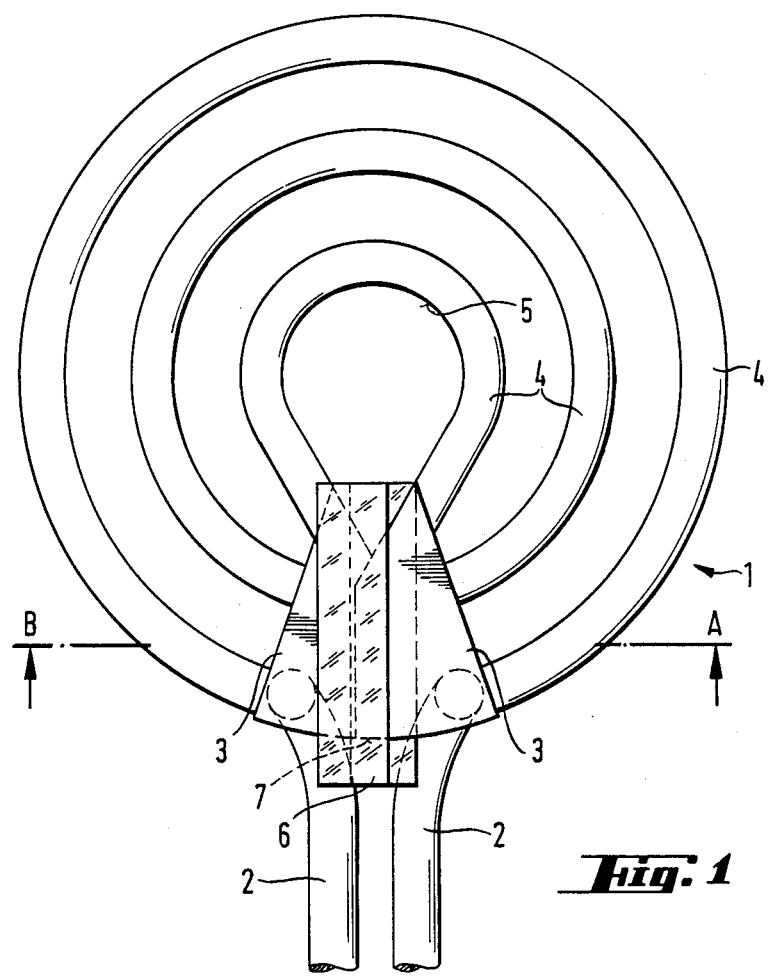
FIG. 1 is a schematic plan view of an induction heating coil embodying the present invention.

Turning now in detail to the drawings, FIG. 1 shows a multi-turn induction heating coil 1. The latter possesses two tubular current conductors 2, by means of which the turns 4 of the coil are supplied in the region of the coil ends 3. The coil slot formed by the overlapping coil ends 3 broadens out, in a funnel shape, toward the inner border 5 of the coil. A movable planar structure or barrier element 6 in the form of a band, folded in a z-shape, made of, for example, quartz glass, is inserted into the coil slot. The band, in order to cover possible electrical arc-over paths, extends into the region—broadened in a funnel shape—of the coil slot and over the outer periphery or border 7 of the coil.

FIG. 1a shows a cross-section through the induction heating coil 1 along the line A–B in FIG. 1. This view shows that, as a result of the shaping of the planar structure 6, not only the possible arcing paths in the coil slot 8, but also those on the upper and lower sides, respectively, of the beveled coil ends 3 terminating the turns or windings 4, are covered.

FIG. 2 shows a single-turn planar coil 9, which can likewise be employed, and the two tubular current supply conductors 2 which are joined to opposite ends of the planar winding or turn 4 which, in turn, merge into the coil ends 3 which overlap one another. The coil slot formed by the latter broadens out in a funnel shape toward the inner border 5 of the coil. In the coil slot there is situated a movable planar structure 6, whose parts project beyond the outer border of the coil and project into its inner opening to prevent arc-overs in these regions.

FIG. 2a shows, in cross-section along the line A–B of FIG. 2, the coil slot formed by the beveled coil ends 3, as well as the insulating planar structure 6 folded in a z-shape.

FIGS. 3a to 3d show, by way of example, some possible cross-sections of the coil slot as well as of the associated insulating planar structures.

Figure 3A:
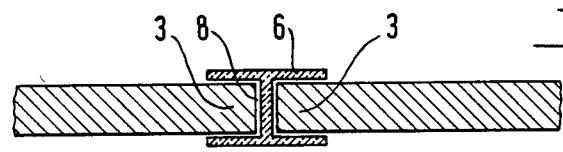

According to FIG. 3a, an insulating planar structure 6 with an H-shaped cross-section can, for example, be employed with non-overlapping coil ends 3.

Figure 3B:
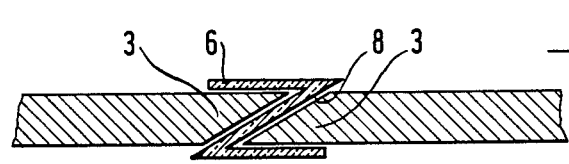

According to FIG. 3b, the overlapping coil ends 3 can, for example, be beveled, so that an obliquely extending coil slot 8 results. The insulating planar structures can then, for example, exhibit a z-shaped cross-section, as a result of which the tips of the coil ends, which are particularly susceptible to the creation of arc-over paths, are surrounded. However, in principle, other forms are also feasible, which comprise, for example, only one coil end at the upper and lower side, or which cover each of the obtuse-angled transition region of the upper and/or lower side of the coil defining the wedge portion of the coil slot.

Figure 3C:
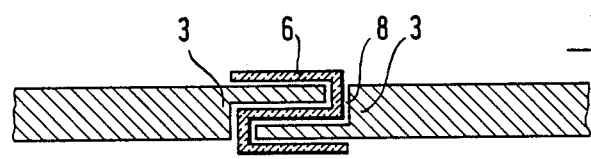

According to FIG. 3c, the overlapping coil ends 3 can also terminate in steps, which overlaps one another and which are surrounded, in the manner shown, by the reverse S-shaped insulating planar structures 6.

Figure 3D:
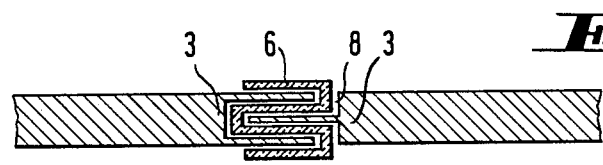

According to FIG. 3d, the coil slot 8 can also be formed by coil ends 3 extending into one another generally in a rabbet joint-like manner, and covered by appropriately shaped insulating planar structures 6.

The possible embodiments presented here are, of course, only illustrative and should not be understood as defining the limits of the inventive concept. It is also feasible, such as, for example, in the case of complicated coil slot geometries, to use multi-path insulating planar structures, which receive their final shape by fitting into one another. However, in such case, particular attention must be paid to possible arc-over paths along the contact surfaces of the individual components.

The induction heating coils according to the invention may, in principle, be employed in the customary zone pulling installations and under the conditions corresponding to the customary zone pulling processes, e.g., with regard to the working atmosphere or the rotation of the rod. A particular advantage resides in the fact that additives to the working atmosphere which reduce the tendency toward arc-over and which, in some circumstances can disturb the crystal growth, can be dispensed with. Indeed, conventional coils can frequently be redesigned, provided that their geometry permits insertion of the planar structures covering the arc-over paths into the coil slot. In other words, even with coils to be produced afresh, the usual dimensions, e.g., internal and external diameters of 20 to 40 mm and 110 to 180 mm respectively, hollow cross-sections and materials, e.g., silver, can be retained. In this connection the coils can be designed as single-turn or multi-turn coils and, for example, can also be designed as planar coils or in demountable form.

With the induction heating coils according to the invention, it is possible in the course of floating zone pulling (even for the pulling of crystalline rods having diameters of 10 to 20 cm and more) to provide the required power densities without the danger of arc-overs or instances of remelting, and to avoid the disburbances of the pulling process which result therefrom.

The invention will now be explained more fully in an example which is, however, only given by way of illustration and not of limitation.

EXAMPLE

By means of a conventional three-turn induction heating coil of silver (internal diameter approximately 30 mm, external diameter approximately 150 mm), which was designed in a similar manner to the coil shown in FIG. 1, but without the funnel-shaped broadening of the coil slot and without the possibility of the use of an insulating planar structure, a monocrystalline rod having a diameter of 100 mm was to be drawn from a polycrystalline silicon supply rod (diameter approximately 100 mm) in a conventional zone pulling apparatus and under the conventional pulling conditions (argon atmosphere at 2.5 bar).

On commencement of the conventional pulling process, the power of the induction heating coil was slowly raised. Even during the initial melting of the supply rod it was, however, impossible to avoid arc-overs in the region of the coil slot. Accordingly, the conventional pulling process had to be discontinued.

Thereafter, in place of this conventional coil, a three-turn induction heating coil, which was designed according to the invention in a manner similar to FIG. 1 and which was made of silver, was installed in the pulling apparatus. The internal diameter amounted to approximately 30 mm, and the external diameter to approximately 150 mm. The coil slot broadened out with an angle of opening of approximately 60° and merged, at a clear width of approximately 15 mm, into the rounding of the inner hole of the coil. After installation had taken place, a planar structure, which was prepared from a quartz glass band having a thickness of approximately 1.2 mm and which was folded in a z-shape, was introduced into the obliquely extending coil slot. This planar structure was formed by the coil ends overlapping one another over a distance of approximately 10 mm and which had a width of approximately 2 mm. The upper and lower sides of the coil were covered by this planar structure over approximately 10 mm, and the length projecting beyond the outer border also amounted to approximately 10 mm. The planar structure projected inwardly to the center of the coil so as to reach a spacing corresponding to the radius of the inner hole.

The pulling process could now be carried out under conventional conditions without difficulty. A dislocation-free monocrystalline silicon rod having a diameter of 10 cm and a length of 50 cm was obtained.

While only several embodiments and one example of the present invention have been shown and described, it will be obvious to one of ordinary skill in the art, that many changes and modifications may be made thereunto without departing from the spirit and scope of the invention.

What is claimed is:

1. In an induction heating coil for a floating zone pulling process of crystalline rods of the type wherein the coil surrounds a rod material to be pulled in a melting zone and has coil ends separated from one another by a coil slot, the improvement comprising:
   a generally planar barrier element made of a temperature-stable insulating material and capable of being movably introduced into the coil slot between said coil ends so as to serve as a barrier to the electrical arc-over paths normally occurring between the surfaces of the coil at differing electrical potentials.

2. The induction heating coil according to claim 1, wherein said temperature-stable, insulating material is quartz glass.

3. The induction heating coil according to claim 1, wherein the coil slot has a funnel shape broadening toward an inner border of the coil which defines a generally annular inner hole.

4. The induction heating coil according to claim 1, wherein the coil slot has an angle of opening of 20° to 120°.

5. The induction heating coil according to claim 3, wherein the width of the opening of the funnel-shaped coil slot, measured at a transition to the annular inner hole of said heating coil, corresponds to 0.3 to 1.8 times the radius of the annular inner hole.

6. The heating induction coil according to claim 1, wherein said coil ends are designed to overlap in the region of the coil slot.

7. An induction heating coil as set forth in claim 1 wherein said generally planar barrier element upon being movably introduced into said coil slot between said coil ends fit loosely therein and without mechanical attachment thereto.

8. An induction heating coil as set forth in claim 1 wherein the crystalline rods pulled by said process have a diameter of at least 10 cm.

* * * * *